United States Patent [19]

Bonora et al.

[11] Patent Number: 5,586,585
[45] Date of Patent: Dec. 24, 1996

[54] DIRECT LOADLOCK INTERFACE

[75] Inventors: Anthony C. Bonora, Menlo Park; Joshua T. Oen, Newark, both of Calif.

[73] Assignee: Asyst Technologies, Inc., Fremont, Calif.

[21] Appl. No.: 394,698

[22] Filed: Feb. 27, 1995

[51] Int. Cl.$^6$ ................................................ B65G 65/00
[52] U.S. Cl. ...................... 141/93; 141/1; 141/91; 141/94; 141/98; 414/217; 414/331; 414/939; 414/940
[58] Field of Search .................... 141/1, 63, 64, 141/67, 70, 82, 91–94, 89, 98; 414/217, 222, 287, 292, 331, 411, 416, 939–941

[56] References Cited

U.S. PATENT DOCUMENTS

| | | | |
|---|---|---|---|
| 4,705,444 | 11/1987 | Tullis et al. | 414/940 X |
| 4,724,874 | 2/1988 | Parikh et al. | 141/98 |
| 4,746,256 | 5/1988 | Boyle et al. | 414/217 |
| 4,851,018 | 7/1989 | Lazzari et al. | 414/217 X |
| 5,217,053 | 6/1993 | Foster et al. | 141/98 |
| 5,277,579 | 1/1994 | Takanabe | 414/939 X |
| 5,340,261 | 8/1994 | Oosawa et al. | 414/217 |
| 5,405,230 | 4/1995 | Ono et al. | 414/217 |
| 5,433,574 | 7/1995 | Kawano et al. | 414/217 |
| 5,468,111 | 11/1995 | Flint et al. | 414/416 |
| 5,478,195 | 12/1995 | Usami | 414/217 X |

*Primary Examiner*—J. Casimer Jacyna
*Attorney, Agent, or Firm*—Fliesler, Dubb, Meyer & Lovejoy

[57] ABSTRACT

A loadlock chamber for transferring one or more semiconductor wafers from a storage and transfer pod into high-vacuum process chambers in a contaminant free environment. The loadlock chamber includes mechanisms for separating a wafer-carrying cassette from the storage and transfer pod, mechanisms for transferring the cassette into a chamber which may be sealed and evacuated, and mechanisms for allowing transfer of wafers between the cassette and the various process chambers, wherein each of the mechanisms operates in an environment that is sealed against the external environment.

41 Claims, 12 Drawing Sheets

DIRECT LOADLOCK INTERFACE

CROSS REFERENCE TO RELATED APPLICATION

This application is related to copending U.S. application Ser. No. 311,954 entitled, "SEMICONDUCTOR WAFER CASSETTE," by Bonora et al., filed Sep. 26, 1994, which application is incorporated by reference herein in its entirety.

BACKGROUND OF THE INVENTION

1. Field of the Invention

The present invention relates to semiconductor wafer manufacturing processes, and in particular, a loadlock chamber for efficient transfer of a wafer cassette from its transfer pod to internal processing stations in a contaminant free environment.

2. Description of the Related Art A standardized mechanical interface (SMIF) system proposed by the Hewlett-Packard Company is disclosed in U.S. Pat. Nos. 4,532,970 and 4,534,389. The purpose of a SMIF system is to reduce particle fluxes onto semiconductor wafers during storage and transport of the wafers through the semiconductor fabrication process. This purpose is accomplished, in part, by mechanically ensuring that during storage and transportation the gaseous media (such as air or nitrogen) surrounding the wafers is essentially stationary relative to the wafers and by ensuring that particles from the ambient environment do not enter the immediate wafer environment.

The SMIF system provides a clean environment for articles by using a small volume of particle-free gas which is controlled with respect to motion, gas flow direction and external contaminants. Further details of one proposed system are described in the paper entitled "SMIF: A TECHNOLOGY FOR WAFER CASSETTE TRANSFER IN VLSI MANUFACTURING," by Mihir Parikh and Ulrich Kaempf, *Solid State Technology*, July 1984, pp. 111–115.

Systems of the above type are concerned with particle sizes which range from below 0.02 µm to above 200 µm. Particles with these sizes can be very damaging in semiconductor processing because of the small geometries employed in fabricating semiconductor devices. Typical advanced semiconductor processes today employ geometries which are one-half micron and under. Unwanted contamination particles which have geometries measuring greater than 0.1 µm substantially interfere with 1 µm geometry semiconductor devices. The trend, of course, is to have smaller and smaller semiconductor processing geometries which today in research and development labs approach 0.2 µm and below. In the future, geometries will become smaller and smaller and hence smaller and smaller contamination particles become of interest.

A SMIF system has three main components: (1) sealed pods, having a minimal volume, used for storing and transporting cassettes which hold the semiconductor wafers; (2) enclosures placed over cassette ports and wafer processing areas of processing equipment so that the environments inside the pods and enclosures (after having clean air sources) become miniature clean spaces; and (3) a transfer mechanism to load/unload wafer cassettes from a sealed pod without contamination of the wafers in the wafer cassette from external environments.

The wafer-carrying cassettes are stored and transported between processing stations in the pods. Many of the wafer fabrication processes are carried out in a high vacuum environment. Before entering the ultra high-vacuum processing station, the wafer-carrying cassettes are transferred from the pods to an intermediate vacuum buffer area. This buffer area, known as a loadlock chamber, serves as a buffer for wafer storage and is a gateway for wafer distribution to the vacuum related processes. The effectiveness of a loadlock chamber is critical to wafer fabrication and can have a significant impact on the cost of wafer manufacturing and the quality of the finished product.

There are several ways to load a cassette into a loadlock chamber, the two most common are manual and mechanical transfer. Manual loading can easily be done if the cassette is of manageable size, but if the cassette is large or heavy, manual loading has certain limitations. One limitation is ergonomics. Continued loading and unloading motion by operators is an industry wide concern because of repetitive motion injury. Another limitation is the risk of wafer damage due to human error. A cassette of wafers can be dropped or bumped resulting in the loss of hundreds of thousands of dollars. If manual loading is to be used, provisions must be made for "elbow room" and hand clearance both in the loadlock doorway and within the loadlock chamber. Consequently, conventional loadlock chambers that are manually loaded must be made larger than necessary for just the wafer cassettes alone. Minimizing the size of a loadlock chamber is important both because space within a clean room environment is critical, and larger loadlock chambers take longer to pump-down to a high-vacuum environment. Additionally, large loadlock chambers are expensive to fabricate. FIG. 1 shows a conventional manual loading system where an operator is transferring a plurality of wafers 6, through an access port 7, and into a conventional loadlock chamber 8. Clearance within the access port and chamber beyond that necessary for the cassette alone must be provided so that the operator may grasp and properly place the cassette within the chamber. Some floor space for the cassette extracting unit is also required for removing the cassette from the SMIF-pod.

Another method of cassette loading involves the use of a mechanical transfer device for placing the cassette inside the chamber 8. These devices function similarly to their human counterpart in that they require floor space and gripping clearance. As such, they suffer the same disadvantage as manually loaded systems in that they require larger loadlock chambers than necessary to accommodate a wafer cassette alone. FIG. 2 illustrates a conventional swing-arm type device 9 between the cassette extraction unit 11 and the loadlock chamber 8.

Both manual and automated loading of cassettes into a loadlock chamber additionally require an extraction device 11 for removing the cassette from the SMIF-pod prior to the chamber loading.

With current wafer cassette loading methods, the need for strict environment control is essential for minimizing wafer contamination. As shown in FIGS. 1–2, conventional loading methods load a cassette into the loadlock chamber through an access port 7. Currently, no system exists for loading a wafer cassette into a loadlock chamber directly from an environmentally sealed pod without exposing the wafers to the surrounding atmosphere. Between the extraction sequence where the cassettes are removed from the pods, and the loading sequence where the cassettes are loaded into the loadlock chamber, the cassette is exposed to the outside air and special precautions are generally required to minimize contamination during this stage. For example, if the environment is of a lower clean room classification than the requirements for wafer processing, a special air management device is needed to ensure wafer cleanliness. These air management devices range from air curtains to full enclosures that surround the loadlock equipment. FIG. 3 shows a conventional filtration system that will provide a degree of clean laminar air flow for the cassette and wafer extraction area. This type of set-up is expensive to implement and maintain, and it does not completely isolate the wafers from the surrounding particulate contaminants. Moreover, such filtration systems are unable to prevent airborne molecular contaminants, such as water vapor and vapor-phase contaminants, from entering into the loadlock chamber, where they can contaminate the semiconductor wafers. Systems for minimizing contaminants are becoming increasingly more important as wafer manufacturing processes presently require control of particle sizes as small as 0.05 to 0.5 microns.

The above described methods for loading cassettes were developed in the early days of semiconductor processing where manual handling was the prime mode for transferring cassettes from one point to another. In the pioneering days the wafer diameters were as small as two inches across. As the semiconductor industry grew, the wafer size increased. Unfortunately the increase in wafer size also made cassettes heavier and more difficult to handle. The current 200 mm wafer size is over 15 times heavier than the 2 inch wafers. With 300 mm diameter wafer processing coming in the near future, wafer handling by conventional methods will be even more difficult due to the added weight and bulk. Moreover, present systems for minimizing contaminants within the wafer and cassette extraction area are costly and not wholly effective in preventing contaminants from reaching the wafers during transport from the pods to the processing stations.

SUMMARY OF THE INVENTION

It is therefore an advantage of the present invention to provide a loadlock chamber for efficiently transferring wafer cassettes from a transfer pod to one or more processing chambers.

It is another advantage of the present invention to provide a loadlock chamber that allows wafers to be loaded into the chamber directly from a transfer pod without exposure to the surrounding environment during transfer.

It is a further advantage of the present invention to provide a smaller loadlock chamber that provides a simpler construction and quicker pump-down times.

These and other advantages are provided by the present invention which relates to a loadlock chamber wherein the entire loading sequence has been streamlined to eliminate unnecessary wafer and cassette transfers. Additionally, the transfer of the wafer and cassette to the loadlock chamber according to the present invention occurs in total isolation from the outside environment, thereby preventing contaminants from reaching the wafers, and reducing air-cleanliness requirements for the area near the loadlock chamber and/or the facility in total.

During transport and storage of a wafer cassette, the cassette is supported within a pod which is comprised of a pod door on which the cassette rests, and a pod cover which mates with the pod door to provide a sealed environment within the pod. According to the present invention, when a cassette is to be transferred to a process chamber, the pod is loaded onto a loadlock chamber such that the pod door lies in contact with a port access door of the loadlock chamber, and the pod cover lies in contact with a port plate assembly of the loadlock chamber, which assembly surrounds the port access door. When the pod is located on the port plate assembly and port access door, a bottom perimeter of the pod registers against an O-ring gasket on the port plate assembly to form an airtight seal between the pod and the loadlock chamber. Thus, once the pod is loaded on the port plate assembly and port access door, all transfers of the cassette(s) and wafers are done in an isolated manner that is unaffected by the outside environment.

The port plate assembly includes a pair of latches that automatically engage and securely hold the pod cover once the pod is located on the loadlock chamber. Thereafter, a pod door decoupling device within the port access door decouples the pod door from the pod cover. Once the pod door is separated from pod cover, the port plate assembly, having the pod cover supported thereon, moves upward so that the pod cover is separated from the pod door and the cassette, which is supported on the pod door. The port plate assembly further includes a pair of pawls positioned on opposite sides of the cassette. During the upward movement of the port plate assembly, the pawls move inward to engage the cassette. As the port plate assembly continues to move upward, the pawls lift the cassette so that the cassette is supported by the port plate assembly and separated from the pod door.

Thereafter, the port access door and the pod door supported thereon are moved laterally away from the loadlock chamber port access. An indexing platform provided within the loadlock chamber below the cassette is moved upward to engage and support the cassette. Once properly positioned on the indexing platform, the pawls are retracted and the cassette is decoupled from port plate assembly and fully supported by the indexing platform. The indexing platform next lowers the cassette into the loadlock chamber interior. Sensors may be provided on either side of the cassette to provide information with regard to specific wafer location and/or cassette slot location as the cassette is lowered into the chamber interior.

Once the cassette is positioned within the chamber interior, the port access door is returned to its position over the loadlock chamber access port to thereby isolate and seal the loadlock chamber. The chamber interior is thereafter evacuated to a high-vacuum environment similar to that of the various wafer fabrication processes. Wafers are then extracted from the cassette by a wafer transfer device internal to the fabrication process chambers, and passed by the transfer device into the various process chambers. The loadlock chamber is provided with one or more access ports, such as for example modular equipment standardization committee ("MESC") access ports, to allow transfer of the wafers between the loadlock chamber and the process chambers. It is possible that a loadlock chamber include a plurality of such access ports radially provided around a circumference of the loadlock chamber at differing elevations of the loadlock chamber for allowing wafer access to various vacuum processes. In this way a single loadlock chamber may supply wafers to a plurality of process chambers.

Another feature of the present invention is the ability to purge a pod of molecular and/or particulate contaminants by infusing a selected gas into a pod after the pod door has been separated from the pod cover. The infusion of gas flushes out or causes the evaporation of contaminants from within the pod. This is beneficial in many applications, especially for long term wafer storage in which the wafers are kept in an inert environment after processing. The purging capability can be done during the majority of the loading and unloading sequence, or in parallel when the wafer is in the vacuum chamber being processed.

After the wafer fabrication processes have been completed, and the wafer cassette is ready for extraction from the loadlock chamber, the chamber is preferably backfilled with clean air or an inert gas so that the chamber is not exposed to contaminant rich air between cycles.

BRIEF DESCRIPTION OF THE DRAWINGS

The invention will now be described with reference to the drawings in which.

DETAILED DESCRIPTION

The present invention will now be described with reference to FIGS. 4 through 13, which relate in general to an intermediate chamber, such as a loadlock chamber, for allowing transfer of semiconductor wafers from ambient conditions to high-vacuum fabrication chambers. The invention will be described herein with regard to semiconductor wafers having a 300 mm diameter, which wafers may be stored and transferred within a SMIF-pod. It is understood, however, that the present invention may operate with semiconductor wafers of various sizes and shapes. The term "semiconductor wafer" or "wafer" as used herein refers to a wafer substrate as it may exist in any of the various stages of the semiconductor wafer fabrication process. Moreover, it is understood that the present invention is not limited to use with SMIF-pods, and may operate in conjunction with any of various containers used to store and transfer the semiconductor wafers.

Figure 1:
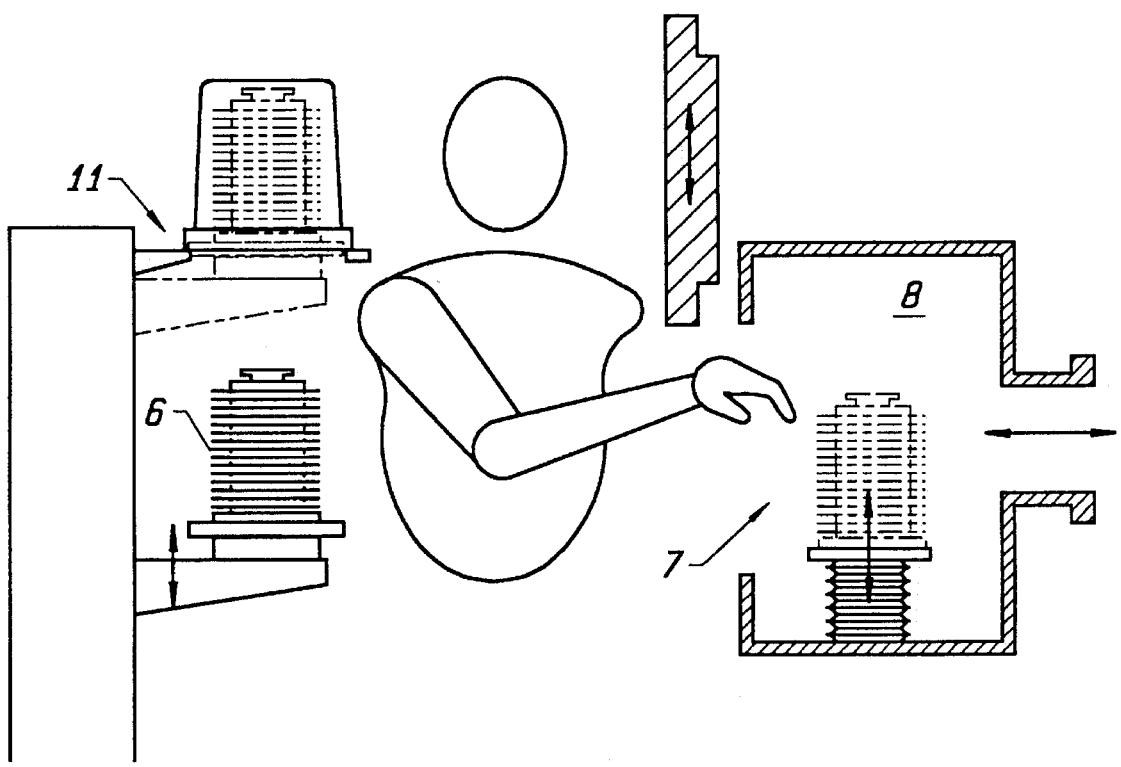
FIG. 1 is a representation of a manual transfer system for transferring a wafer cassette into a conventional loadlock chamber.
Figure 2:
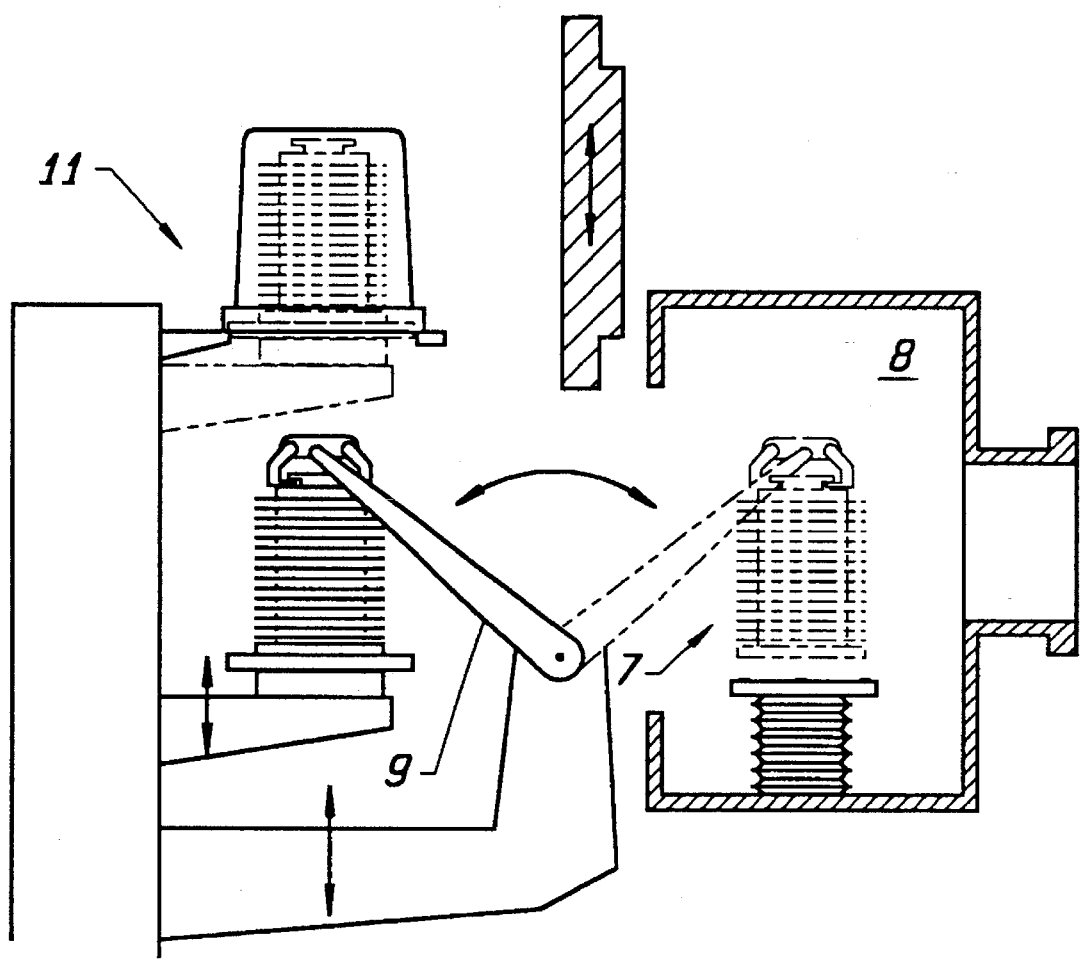
FIG. 2 is a representation of an automated transfer system for transferring a wafer cassette into a conventional loadlock chamber.
Figure 3:
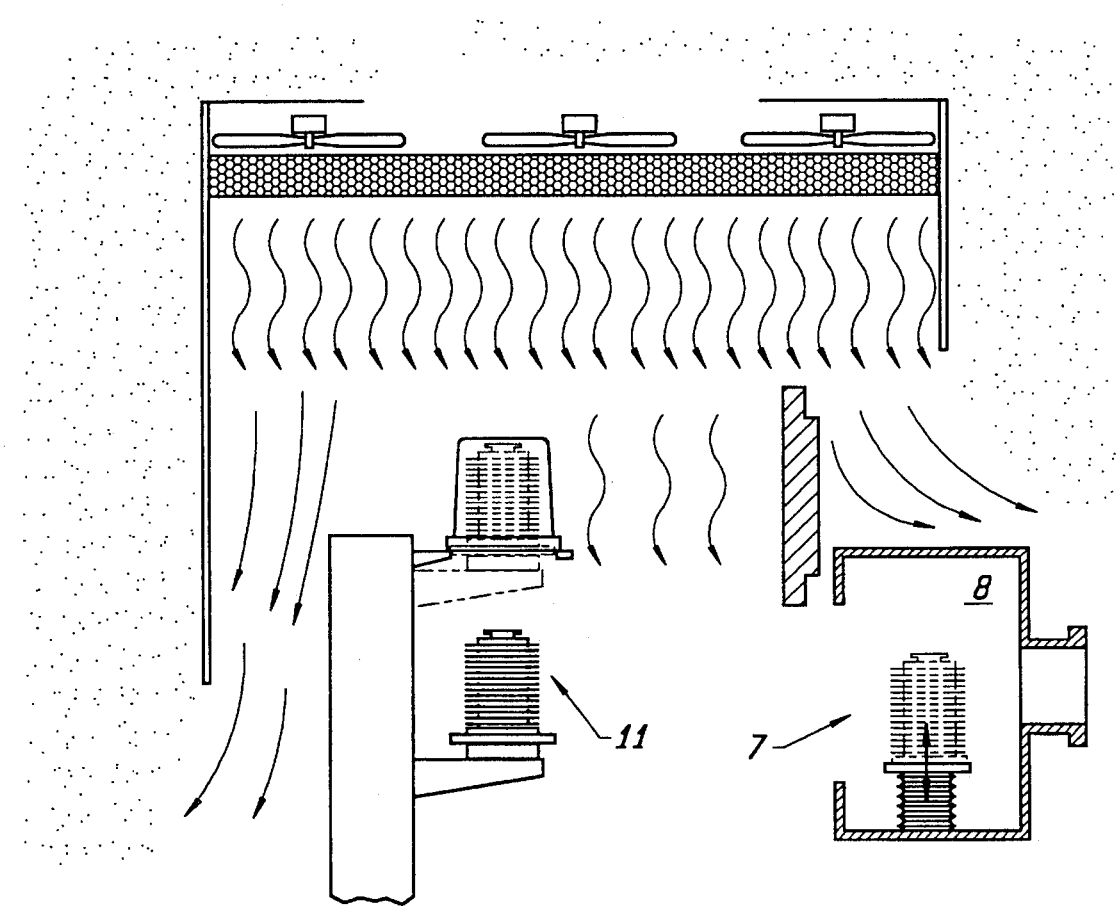
FIG. 3 is a representation of a conventional filtration system used to minimize the presence of contaminants in the cassette transfer area.
Figure 4:
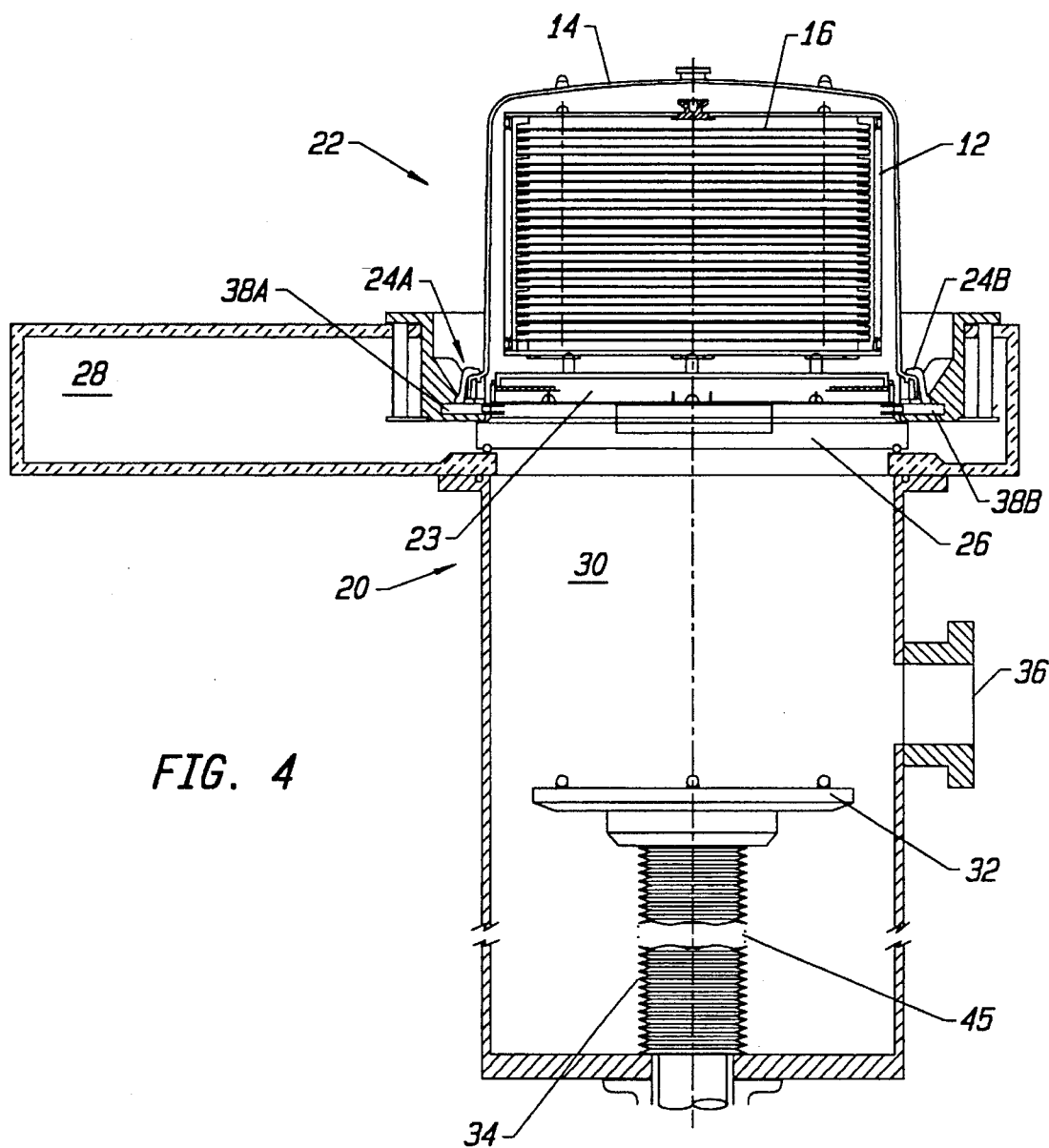
FIG. 4 is a side view of a loadlock chamber according to the present invention.
Figure 4A:
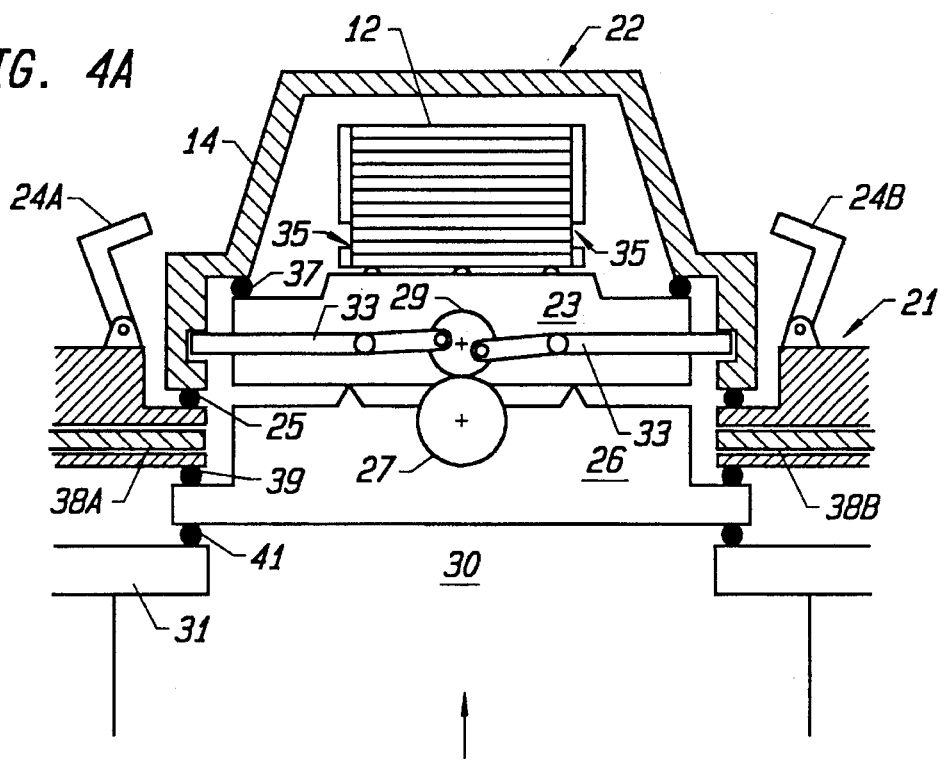
FIG. 4A is a side cross-sectional view of a loadlock chamber according to the present invention showing the port plate assembly and port access door engaging a transfer pod.

The semiconductor wafers are supported in a support structure such as cassette 12 shown in FIGS. 4 and 4A and described in U.S. application Ser. No. 08/311,954 previously incorporated by reference. Generally, the cassette includes top and bottom plates of substantially circular shape. Attached to and extending between the top and bottom plates are four columns; two side columns, and two rear columns. The side columns are both provided with a plurality of shelves, each shelf defining a plane in which a single semiconductor wafer 16 may be securely supported. The plurality of shelves together support the plurality of wafers in a parallel and coaxial relation. The shelves and columns together also define an opening in the cassette through which wafers are inserted and extracted from the cassette. The spacing of the wafers within the cassette is largely dictated by a wafer transfer device, described hereinafter, which slides between adjacent wafers to lift and slide a wafer out of the cassette for processing. It is understood that the present invention may operate with cassettes of various form factors, shapes and designs.

The cassette 12 may be stored and transported in a conventional SMIF-pod 22 that includes a pod cover 14 and pod door 23. The cassette is normally supported on the pod door during storage and transport of the cassette. A sealing gasket 37 (FIG. 4A) is provided between the cover 14 and door 23 to isolate and seal the interior of pod 22 against the external environment.

FIGS. 4 and 4A show a loadlock chamber 20 according to the present invention with a pod 22 located thereon. The loadlock chamber 20 includes a port plate assembly 21 having pod cover restraint latches 24a and 24b, pawls 38a and 38b, and a perimeter O-ring gasket 25. Loadlock chamber 20 further includes port access door 26, purging chamber 28, interior operation chamber 30, indexing platform 32 mounted on telescopic shaft 45, and at least one access port 36. A central processing unit ("CPU") (not shown) is provided for controlling the operation of, and for monitoring feedback signals from, the various components of the loadlock chamber 20.

In preparation for transferring the wafers 16 into the various wafer fabrication process chambers, the pod 22 is manually or automatedly seated on top of the loadlock chamber. The top of the loadlock chamber may include a plurality of angled guide blocks (not shown) to allow easy guidance of the pod into proper position on top of the loadlock chamber.

When properly located on top of the loadlock chamber 20, the pod door 23 lies in contact with the port access door 26, and the outer rim of pod cover 14 lies in contact with the port plate assembly 21. In this position, a bottom perimeter of the pod cover 14 registers against the O-ring gasket 25 on the port plate assembly to form an airtight seal between the pod 22 and the port plate assembly 21. Thus, once the pod is loaded on the loadlock chamber, all transfers of the cassette(s) and wafers are done in an isolated manner that is unaffected by the outside environment.

Pod cover restraint latches 24a and 24b are provided to secure the pod cover 14 to the port plate assembly 21. Once the pod 22 is properly positioned on the loadlock chamber, the latches 24a and 24b are pivoted from a first position shown in FIGS. 4 and 4A to a second position shown in FIGS. 5 and 5A. In the second position, the latches 24a and 24b positively secure the pod cover to the port plate assembly. The movement of the latches 24a and 24b between the first and second positions may be accomplished by a conventional solenoid or motor, the operation of which solenoid or motor is controlled by the CPU.

After the latches 24a and 24b secure the pod cover 14 to the port plate assembly 21, the pod cover 14 is decoupled from the pod door 23. This is accomplished by a decoupling mechanism provided in the port access door 26. The decoupling mechanism may comprise a gear 27 that meshes with a gear 29 conventionally provided within the pod door 23. Rotation of the gear 27 rotates the gear 29, which in turn causes arms 33 to retract from their engagement with the pod cover 14, thereby separating the pod cover from the pod door. As would be appreciated by those skilled in the art, the decoupling mechanism may be comprised of structures other than a gear 27 to retract arms 33 from engagement with the pod cover to thereby separate the pod cover from the pod door. Gear 27 may be driven by a driver motor (not shown) or similar device, the operation of which is controlled by the CPU. It is further understood that, in alternative embodiments, the decoupling mechanism may decouple the pod cover from the pod door before or during pivoting of the latches 24a and 24b to the restraining position.

Figure 5:
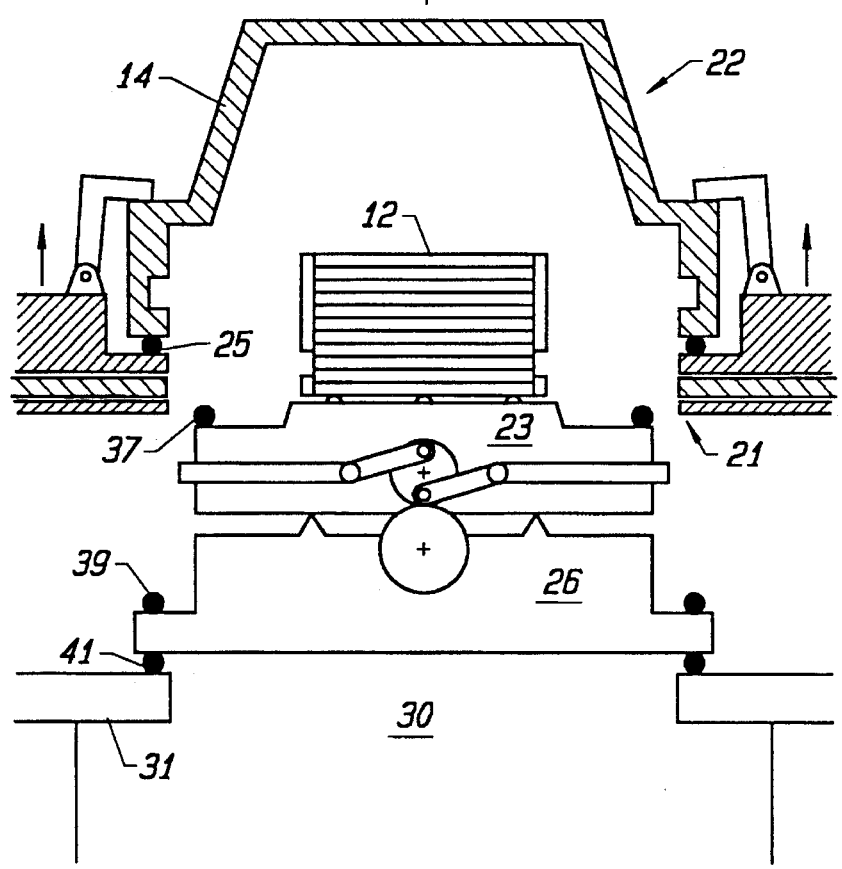
FIGS. 5 and 5A are side views of a loadlock chamber according to the present invention showing the cassette and pod cover translating away from the pod door.

After the pod cover 14 has been separated from the pod door 23, the port plate assembly moves in an upward direction as shown in FIG. 5. The pod cover 14, supported on the port plate assembly 21, moves upward with the port plate assembly. The pod door 23 and the cassette 12, supported on the port access door 26, remain stationary.

Figure 5A:
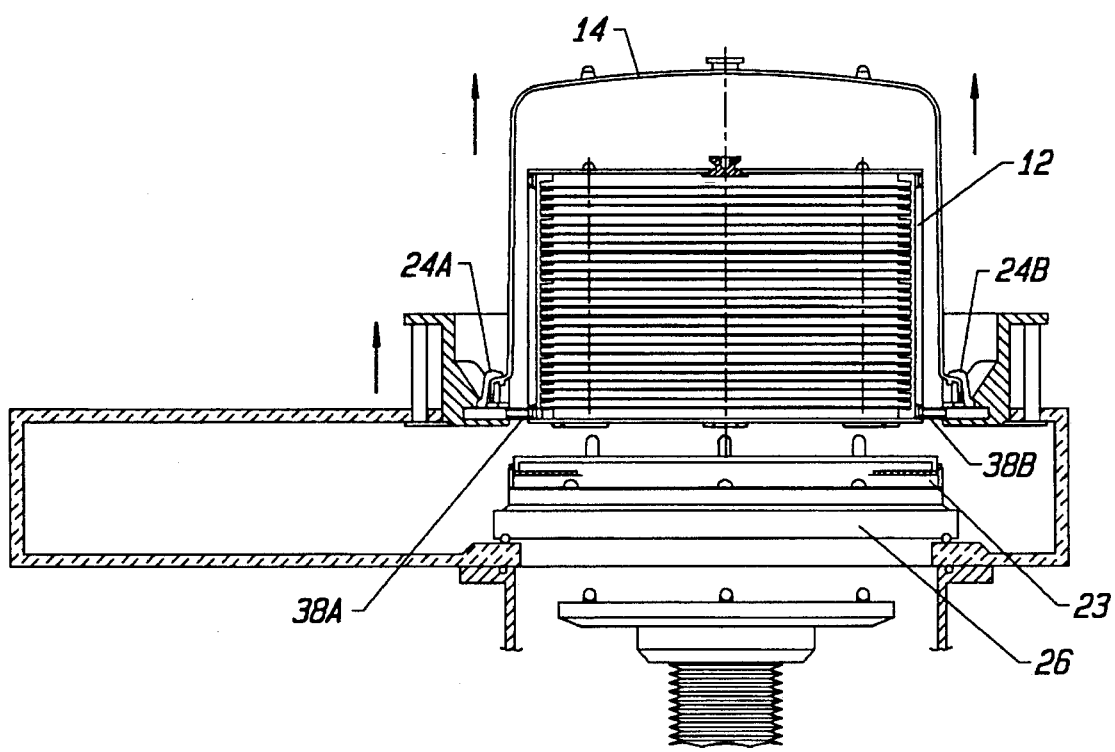

At some point during the upward movement of the port plate assembly, pawls 38a and 38b will be horizontally aligned with a pair of slots 35 formed in opposite sides of the cassette 12. Details relating to the structure and operation of pawls 38a and 38b and cassette slots 35 are set forth within application Ser. No. 08/311,954, which application has been incorporated by reference above. Once horizontally aligned with the slots 35, the pawls 38a and 38b move inward from their retracted position to rest within slots 35. With the pawls 38a and 38b engaged within the slots 35, continued upward movement of the port plate assembly lifts and separates the cassette 12 from the pod door 23, so that the cassette 12 is supported independently from the pod door 23 as shown in FIG. 5A. Lateral translation of pawls 38a and 38b may be accomplished by a conventional motor (not shown) or similar device, the operation of which is controlled by the CPU.

The sealing of the pod 22 and loadlock chamber will now be explained with reference to FIGS. 4, 4A and 5. When the pod 22 is first located on top of the loadlock chamber 20, there are three isolated environments within the system. The first is within the pod 22. The pod cover 14 and pod door 23 mate with each other, and a gasket 37 provided between the cover and door provides an isolating seal against the external environment. The second isolated environment is defined by the purging chamber 28 (the purpose and operation of which shall be explained hereinafter). Gaskets 39 and 41 are provided between the port plate assembly 21 and an upper surface of port access door 26, and between a lower surface of port access door 26 and operation chamber interior walls 31, respectively, to isolate and seal the purging chamber 28. The third isolated environment that exists when pod 22 is first located on the loadlock chamber is within interior operation chamber 30. Gasket 41 provides a seal between the port access door 26 and the operation chamber 30 to isolate the interior of the chamber 30.

As shown in FIG. 5, after the port plate assembly moves upward and the pod cover 14 is separated from the pod door 23, gasket 37 no longer provides a seal for the interior of the pod, and gasket 39 no longer provides a seal for the interior of the purging chamber. At this point, the interior of the pod and the interior of the purging chamber comprise a single isolated environment that remains sealed against the external environment. The seal is accomplished by O-ring gasket 25 provided between the port plate assembly 21 and the pod cover 14. As previously explained, this seal is established when the pod 22 is located on the loadlock chamber 20. Additionally, as is known in the art, a seal is provided between the movable port plate assembly 21 and the purge chamber housing. Thus, the wafers within the cassette remain isolated from the external environment even after the pod cover 14 is separated from the pod door 23.

Port access door 26 is preferably formed of a non-reactive metal, and serves both to allow access to and to seal the interior of loadlock chamber 20. In a preferred embodiment, port access door 26 is substantially circular, and has a diameter of approximately 15 inches. The thickness of the door 26 is approximately 1.5 inches. It is understood that port access door 26 may be configured to a different shape to conform to various configurations of the loadlock chamber.

Figure 6:
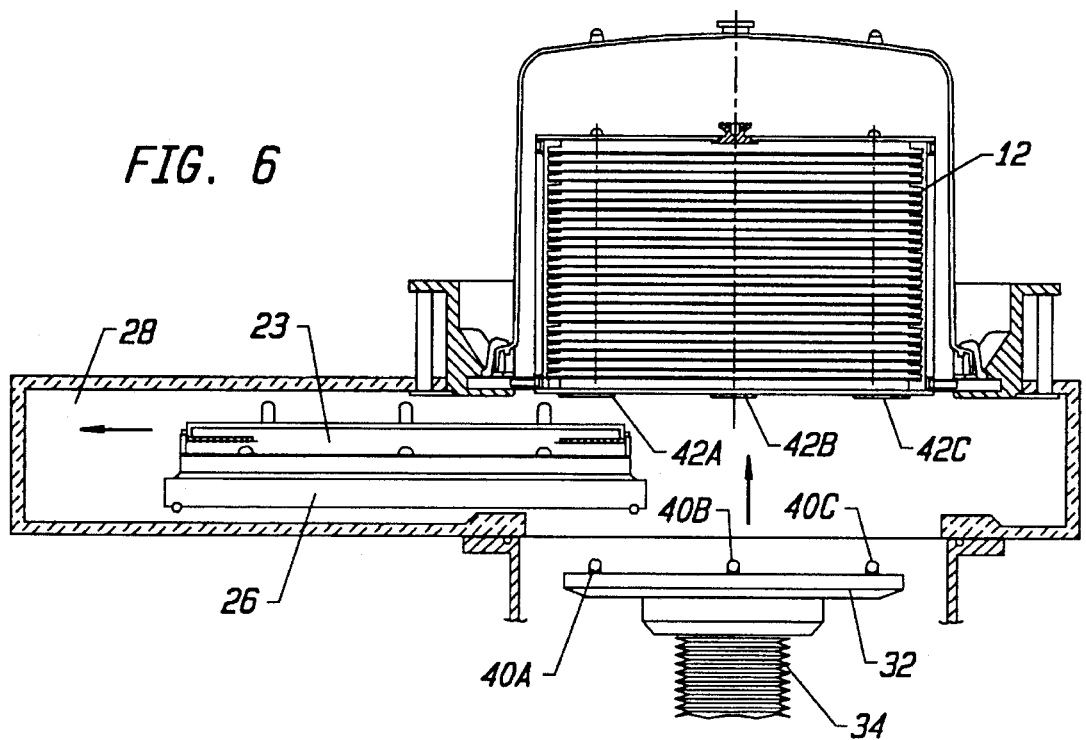
FIG. 6 is a side view of a loadlock chamber according to the present invention with the port access door and pod door translating away from the port access.
Figure 7:
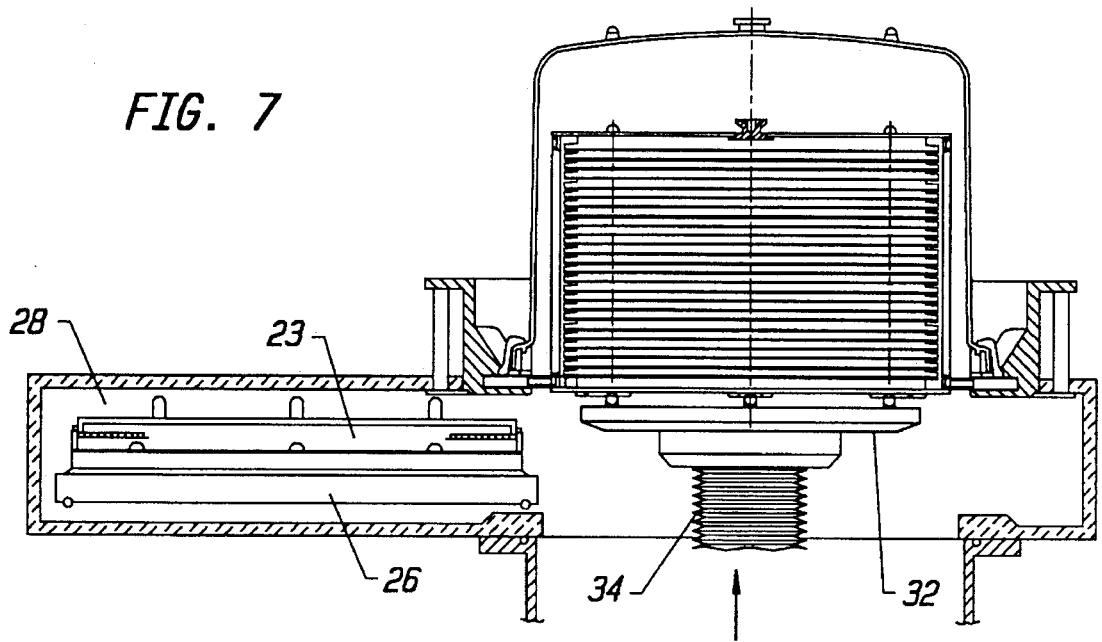
FIGS. 7–8 are side views of a loadlock chamber according to the present invention with the wafer cassette supported on an indexing platform.

As shown in FIGS. 6 through 7, after the wafer cassette has been separated from the pod door 23, pod door 23 and port access door 26 are moved laterally away from the loadlock chamber port access. Alternatively, the pod door and port access door may be pivoted about a central axis away from the chamber port access. The movement of the port access door is accomplished by means of a motor or jack screws (not shown) or other similar device, the operation of which is controlled by the CPU. At this point, the interior of the pod cover, the purging chamber, and the interior of the loadlock chamber all comprise a single environment that is isolated and sealed against the external environment.

Once the pod door 23 and port access door 26 are fully located within the purging chamber 28, indexing platform 32 is moved upward to engage the wafer cassette. When indexing platform 32 engages the wafer cassette, the pawls 38a and 38b disengage the cassette so that the cassette is decoupled from the port plate assembly 21 and fully supported on the indexing platform 32. As is known in the art, a mechanical sensor, for example, may be provided within the platform to indicate when the indexing platform has engaged the wafer cassette.

The wafer cassette is aligned on the indexing platform 32 by means of extensions 40a, 40b, and 40c, which extensions are received within troughs 42a, 42b, and 42c on the bottom of the cassette 12. The specific configuration and engagement of extensions 40 and troughs 42 are described in greater detail in application Ser. No. 08/311,954, which application has previously been incorporated by reference.

Indexing platform 32 is supported and vertically translated by means of telescopic shaft 45, which extends down out of the bottom of the loadlock chamber. A motor or similar device (not shown), located below the chamber and which is controlled by the CPU, raises and lowers the telescopic shaft to the desired elevation. A conventional metal, accordion-type bellows 34 is provided around the telescopic shaft 45 to provide a vacuum seal between the opening in the bottom of the chamber for the shaft 45 and the interior of the loadlock chamber. The bellows 34 expands and contracts along its length so as to always extend between the bottom of the interior operation chamber 30 and the bottom surface of the indexing platform 32.

Figure 8:
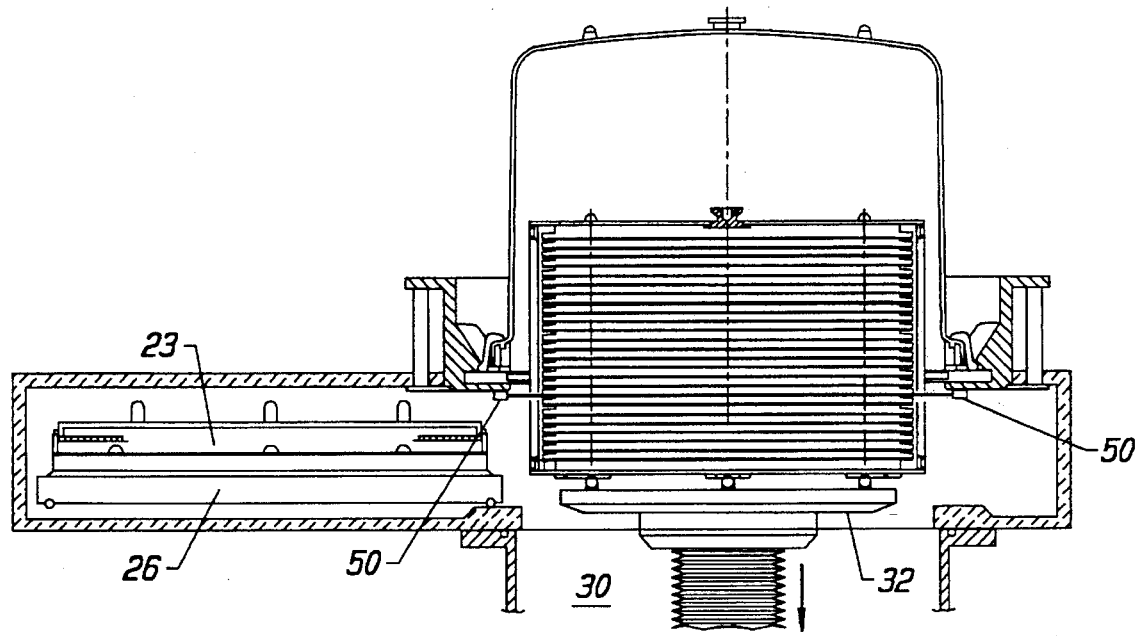
Figure 9:
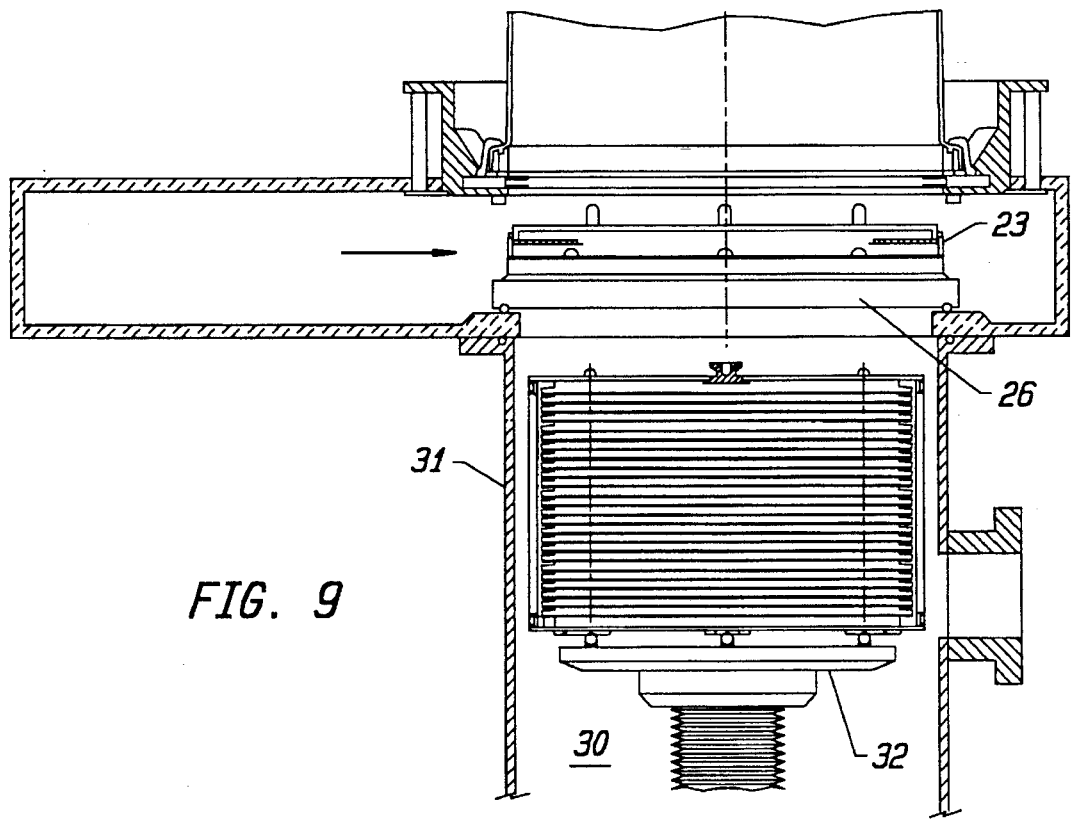
FIG. 9 is a side view of the loadlock chamber according to the present invention with the cassette sealed within the loadlock chamber interior.

As shown in FIGS. 4, 8 and 9, after the wafer cassette is properly supported on the indexing platform 32, the indexing platform translates downward to bring the wafer cassette and wafers into the interior operation chamber 30. After the wafer cassette is entirely located within interior operation chamber 30, the port access door 26 and pod door 23 are once again moved laterally and port access door 26 is once again located over the loadlock chamber to seal the operation chamber of the loadlock chamber against the external environment. In a preferred embodiment, loadlock chamber preferably has a cylindrical form factor, and the volume of the interior operation chamber 30 is approximately 3000 cubic inches, with an interior diameter of approximately 14 inches and a height of approximately 20 inches. It is understood that the form factor, configuration and overall volume of the interior operation chamber 30 may vary in alternative embodiments of the invention, as for example when wafers having diameters lesser or greater than 300 mm are used. The walls 31 surrounding the interior operation chamber are preferably formed of a non-reactive metal and have a wall thickness of approximately 0.25 to 0.375 inches. This relatively thin wall thickness provides the advantage of easier and less expensive chamber fabrication and also provides a loadlock chamber that is lighter than conventional loadlock chambers.

Through the above described mechanisms and steps, a wafer cassette 12 may be transferred directly from a pod 22 to the interior operation chamber 30 of loadlock chamber 20 without exposure to the atmosphere surrounding the pod or loadlock chamber. As described in the Background of the Invention section, conventional systems required that a wafer and wafer cassette be exposed to the atmosphere surrounding both the pod and loadlock chamber in order to transfer the wafer cassette from the pod to within the loadlock chamber.

Figure 10:
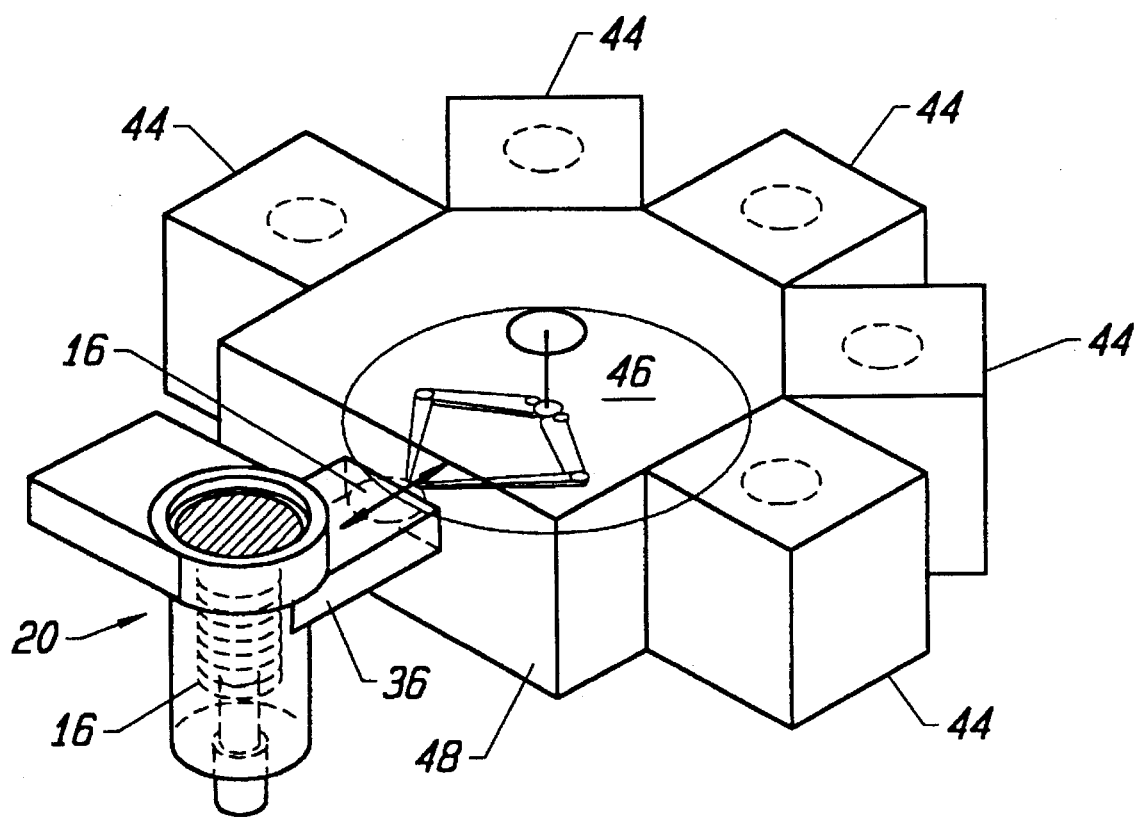
FIG. 10 is a perspective view of a loadlock chamber according to the present invention in relation to wafer processing chambers.

Once sealed, operation chamber 30 is evacuated by means of a pump (not shown) to a pressure of approximately $10^{-3}$ to $10^{-8}$ Torr. As is known in the art, any of several pumps may be used to accomplish the evacuation, such as for example a mechanical roughing pump or diffusion pump. Once the interior operation chamber 30 has been evacuated to the desired pressure, wafers from the cassette may be transferred to one or more high-vacuum wafer fabrication processes within processing chambers 44 (FIG. 10). A processing chamber 44 may comprise, for example, a chemical vapor deposition, plasma etching, or other such high-vacuum process chamber. The final pressure at which the fabrication processes take place within the processing chambers may be different than the evacuated pressure within the loadlock chamber. However, at the point when the loadlock chamber is opened to the process chambers, the pressures may be the same to prevent air currents and a circulation of any contaminants that may be in the chambers. After the loadlock chamber has been opened to the process chambers, the pressure may be pumped up or down to the desired processing pressure. Alternatively, because there is substantially a vacuum at the pressures in question and the air currents will be minimal, the pressure in the loadlock chamber may be slightly different than the pressure within the fabrication process chambers when the loadlock chamber is opened to the process chambers.

As shown in FIG. 10, loadlock chamber 20 further includes access ports 36 for providing access by the wafers to the various fabrication processes taking place within processing chambers 44. The access ports may be modular equipment standardization committee ("MESC") access ports or similar type access ports. An access port 36 is closed when the cassette 12 is first lowered into the interior operation chamber 30, and opens to the process chambers after the interior operation chamber 30 is sealed and evacuated. The loadlock chamber 20 shown in FIG. 10 includes one access port 36 connecting loadlock chamber 20 with the plurality of wafer processing chambers 44. Although not critical to an understanding of the present invention, a wafer transfer device 46 is mounted within a main staging area 48 central to the various wafer processing chambers. Wafer transfer device 46 extends through access port 36 and into the wafer cassette to access a particular wafer 16. Once supported on the transfer device 46, the wafer 16 is withdrawn from the cassette, passed through the access port 36 and then transferred between the various wafer processing chambers. Upon completion of the various fabrication processes, the wafer transfer device 46 once again returns the wafer through the access port 36 and back to its position within the cassette 12.

Figure 11:
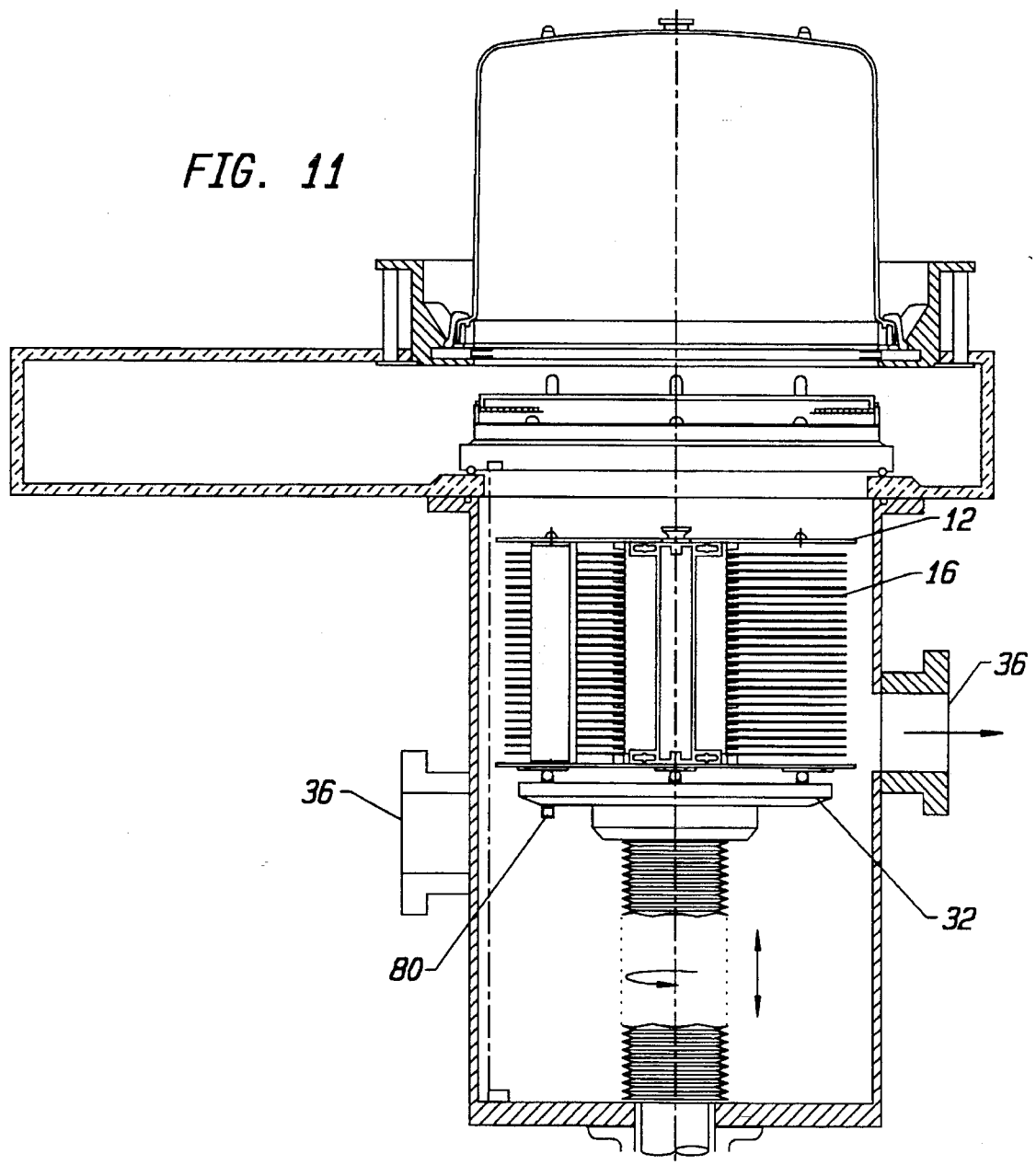
FIG. 11 is a side view of a loadlock chamber according to the present invention showing a plurality of access ports.

In an alternative embodiment of the present invention shown in FIG. 11, loadlock chamber 20 may include more than one access port 36. Thus, a single loadlock chamber according to the present invention may allow access to a large number of wafer fabrication processes.

As previously described, wafers are inserted and extracted from the wafer cassette 12 through a front opening in the cassette. Therefore, it is necessary in one embodiment that indexing platform 32 rotate within interior operation chamber 30 so as to align the front opening of the cassette with the various access ports 36. Indexing platform 32 may be controlled by the CUP to rotate with respect to telescopic shaft 45. Alternatively, both the indexing platform and the shaft may be controlled to rotate together. As previously stated, the access ports 36 may be provided at locations around the circumference of the loadlock chamber and also at different elevations. As is known in the art, sensors within the platform, such as sensor 80, may be provided to indicate the rotational orientation of the cassette, so as to allow proper alignment of an opening of the cassette with a particular access port.

Figure 12:
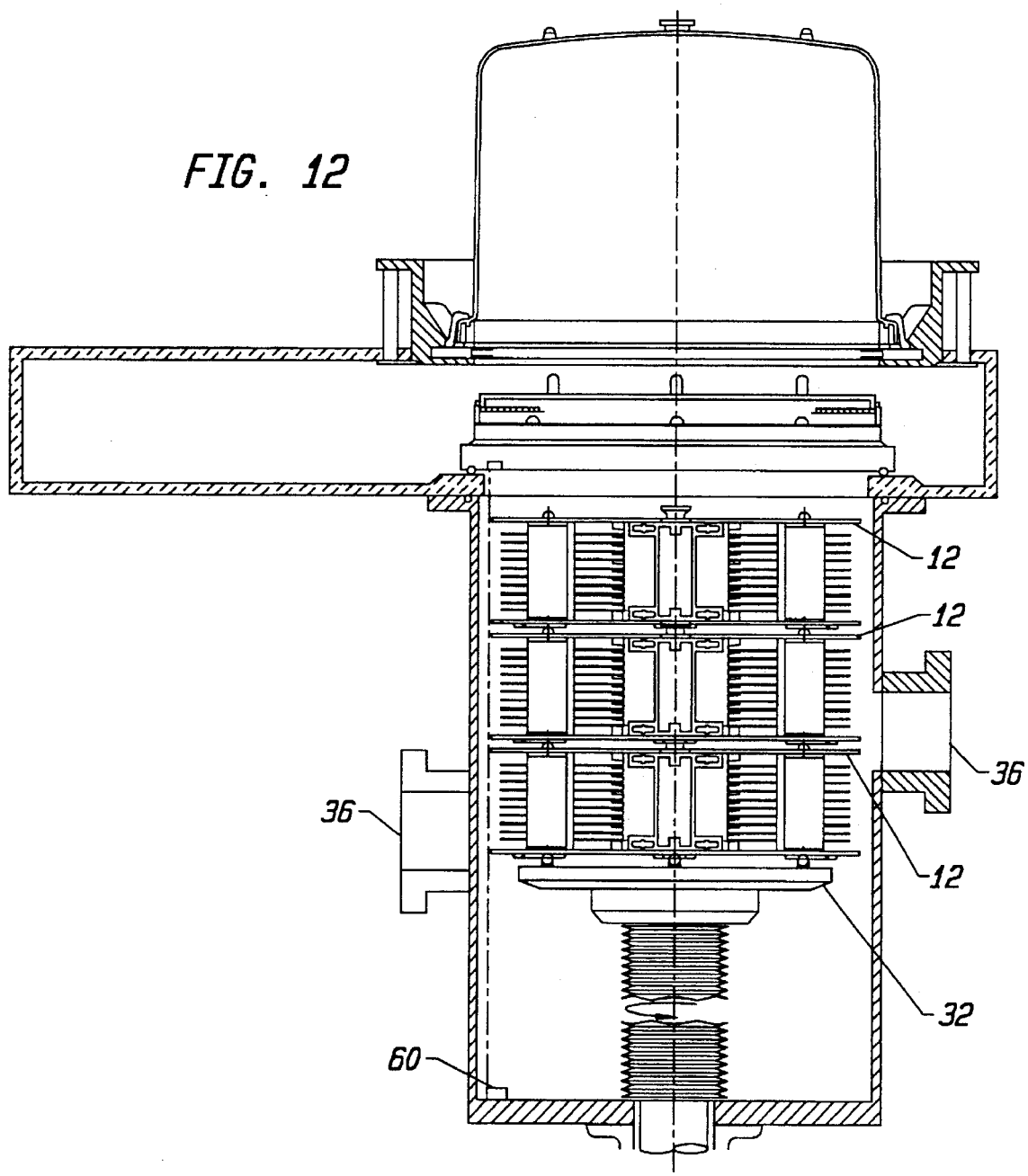
FIG. 12 is a loadlock chamber according to the present invention holding a plurality of stacked cassettes.
Figure 13:
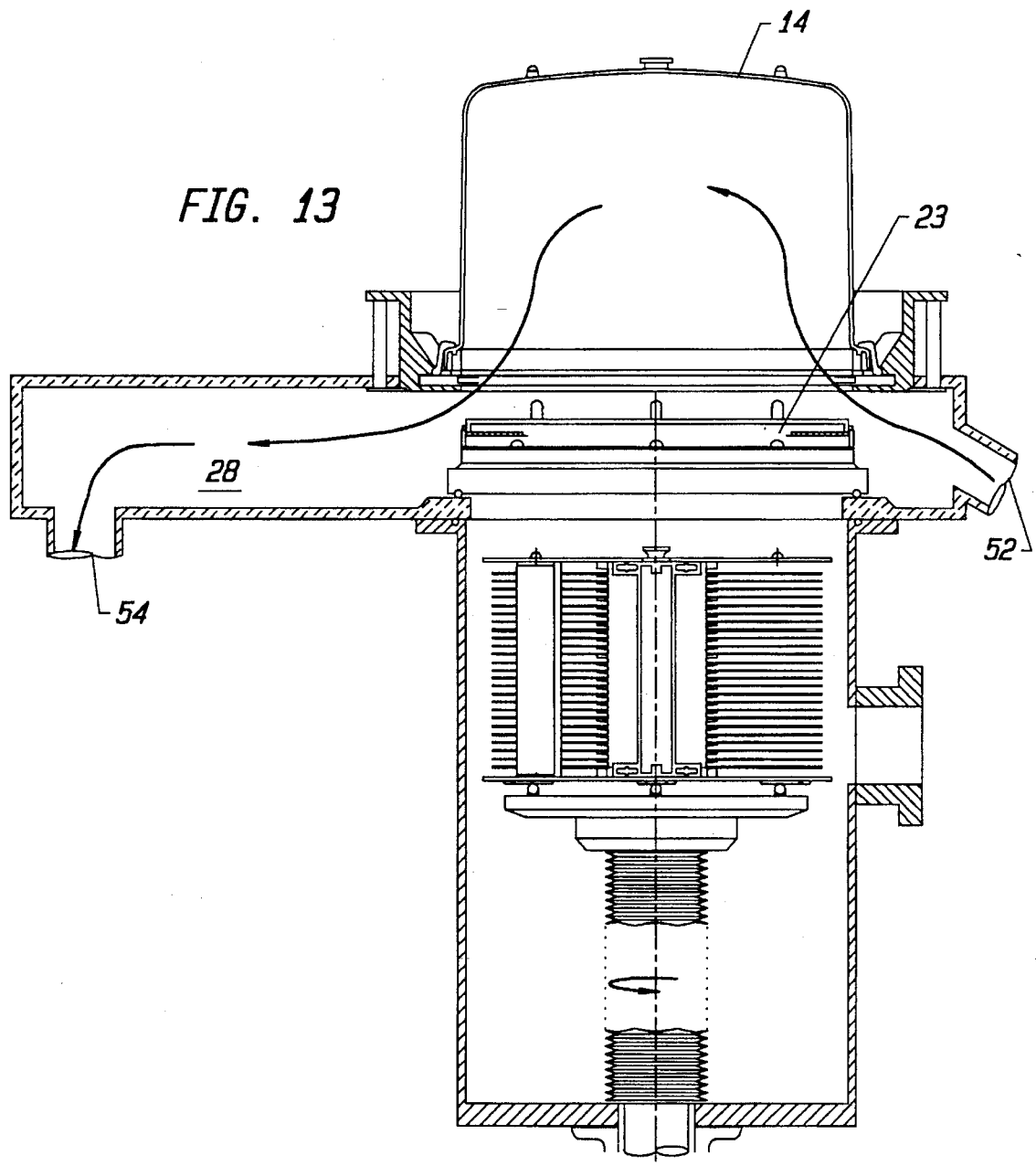
FIG. 13 is a side view of a loadlock chamber showing the gas purging feature according to the present invention.

As described in U.S. application Ser. No. 08/311,954 previously incorporated by reference, the cassettes 12 may be provided so that a plurality of cassettes may be stacked one on top of another. As shown in FIG. 12, the loadlock chamber according to the present invention is provided to accommodate a plurality of such stacked cassettes 12. It is understood that in alternative embodiments, the height of loadlock chamber 20 may be increased to accommodate larger number of stacked cassettes. It is further contemplated that a first cassette 12 may be loaded into the interior operation chamber 30 as described above. Thereafter, with the first cassette 12 sealed within the operation chamber 30, the pod cover and pod door for the first cassette are moved away, and a second cassette 12 within a second pod 22 is loaded onto the loadlock chamber. After the pod door and cover of the second pod have been separated, the port access door and pod door may be translated or pivoted away from the chamber access as described above, and the second cassette may be loaded on top of the first cassette within the chamber interior. In this way, a plurality of cassettes may be loaded into the loadlock chamber according to the present invention one at a time.

As best seen in FIG. 8, the loadlock chamber may be provided with sensors 50 located on opposite sides of the cassette. As described in U.S. application Ser. No. 08/311,954, the precise spacing between each wafer, both in the single and stacked cassette configuration, is known. Therefore, sensors 50 may record the exact vertical position of each wafer within the loadlock chamber. As the indexing platform lowers into the chamber and a particular wafer is sensed by the sensors 50, a wafer identifier and the absolute distance of the wafer from a surface of the indexing plate, for example, may be stored in the CPU memory. Thereafter, as the precise vertical position of the indexing platform is known, the precise vertical position of the wafer within the loadlock chamber is known. Such information is vital to accurate positioning of a particular wafer with respect to an access port 36 and with respect to a wafer transfer device 46. Additionally, as the precise vertical position of the indexing platform is known, the precise vertical position of the various cassette slots within a cassette are also known. This information is essential to accurate positioning a cassette slot with respect to a wafer that is to be inserted by the transfer device 46 into that slot. Also, sensors 50 allow any wafers which are "cross slotted", i.e., provided within the cassette on a slant, to be detected and corrected.

As shown in FIG. 12, wafer protrusion sensors 60 may additionally be provided within the operation chamber 30 of the loadlock chamber to determine if a wafer is not fully seated within the cassette. While only one such sensor is shown in FIG. 12, more than one may be provided around the periphery of the chamber. As is known in the art, any of various sensing systems may be used as sensors 50 and 60, including a light or laser emitter and receiver.

It is further understood that various other sensing systems may be provided within the chamber for insitu measurement-of a variety of wafer and/or system characteristics. For example, sensors may be provided to read information on the wafer such as a bar code, or to measure properties such as wafer film thickness and uniformity, surface roughness, moisture content, and film conductivity. Such sensors may be provided within the operation chamber 30 or within the access ports 36. Electrical leads may be provided through the chamber walls 31 to carry the signals from the various sensors to the CPU and/or to the CPU memory storage for future use. Alternatively, a section of the walls 31 may be formed of a transparent material so that a sensor within the operation chamber 30 may be read from outside of the chamber.

Another feature of the invention is that a wafer may be withdrawn from a particular location within a particular cassette by wafer transfer device 46, the vertical position of the cassette(s) within the chamber varied, and then reinserting the wafer into a cassette at a new location. In this way, for example, a "good" wafer provided within a cassette including otherwise "bad" wafers may be moved to a cassette including other good wafers.

The pod 22 is effective in preventing particulate contaminants from the surrounding environment from contacting the wafers. However, it is more difficult to prevent molecular-sized contaminants, such as water vapor or vapor-phase contaminants from permeating into the pod. Therefore, the present invention includes a gas purging feature shown in FIG. 13. Sometime after pod door 23 has been separated from the pod cover 14, a purging gas is injected through vent 52 whereafter it circulates within the pod cover and eventually exits through vent 54 in purging chamber 28. Thus, contaminants within the pod and the purging chamber 28 prior to purging are flushed out. Moreover, the purging gas can be conditioned prior to injection into the vent 52 to better remove contaminants from the pod. For example, the gas may be heated to evaporate and flush out vapor contaminants from the walls of the pod and purging chamber. Other ways of conditioning the purging gas include ionizing the gas and chemically filtering the gas.

The purging operation may be carried out during the majority of the loading and unloading sequence of the cassette to and from the operation chamber 30. Alternatively, this purging operation may be carried out after the wafer cassette is fully contained within the chamber 30, and the operation chamber is sealed by port access door 26. Any of various gasses may be used as the purging gas including relatively inert gasses such as nitrogen, noble gases such as argon, and chemically filtered air.

After the wafer fabrication processes are complete, and the wafers have been returned to the wafer cassette, the operation chamber 30 of the loadlock chamber is backfilled with gas in preparation for opening of port access door 26 and return of the wafer cassette to the pod. The chamber 30 may preferably be backfilled with gasses similar to those used for the purging gas described above to minimize the possibility of exposure to ambient clean room air which may contain oxygen water vapor and other harmful molecular level contaminations.

Although the invention has been described in detail herein, it should be understood that the invention is not limited to the embodiments herein disclosed. For example, although reference has been made herein to a SMIF-pod, it is understood that other types of pods may be used. Moreover, it is contemplated that a wafer-carrying cassette without a protective housing may be used. In this embodiment, the cassette may be placed on the loadlock chamber port access door, and thereafter some sort of cover may be placed over the cassette and onto the port plate assembly to provide a seal once the port plate assembly is raised upward. Various other changes, substitutions and modifications may be made thereto by those skilled in the art without departing from the spirit or scope of the invention as described and defined by the appended claims.

We claim:

1. A loadlock chamber for transferring at least one semiconductor wafer supported within a support structure from a pod into a wafer fabrication process chamber without exposing the at least one semiconductor wafer or support structure to an atmosphere exterior to the pod and loadlock chamber, the pod including a pod door and a pod cover mating with the pod door, the loadlock chamber comprising:

means for receiving the pod;

means for separating the support structure from the pod door and pod cover prior to loading the support structure into an interior of the loadlock chamber without exposing the support structure or at least one semiconductor wafer to the atmosphere exterior to the pod and loadlock chamber; and means for loading the support structure into said interior of the loadlock chamber without exposing the support structure or at least one semiconductor wafer to the atmosphere exterior to the pod and loadlock chamber, said interior including means for allowing transfer of the at least one semiconductor wafer from said interior to the wafer fabrication process chamber.

2. A loadlock chamber as recited in claim 1, said loading means comprising a plate on which the support structure is supported, said plate capable of translation to transfer the support structure into and out of said interior of the loadlock chamber.

3. A loadlock chamber as recited in claim 2, further comprising a translational sensor for sensing a vertical orientation of the at least one semiconductor with respect to said interior of the loadlock chamber.

4. A loadlock chamber as recited in claim 2, wherein the support structure comprises at least one slot in which the at least one semiconductor wafer is seated, the loadlock chamber further comprising a translational sensor for sensing a vertical orientation of the at least one slot with respect to said interior of the loadlock chamber.

5. A loadlock chamber as recited in claim 2, said plate being further capable of rotation about a vertical axis.

6. A loadlock chamber as recited in claim 5, the loadlock chamber further comprising a rotational sensor for sensing a rotational orientation of the support structure on said plate with respect to said interior of the loadlock chamber.

7. A loadlock chamber as recited in claim 1, further comprising at least one alignment sensor for sensing when the at least one semiconductor wafer is not properly located within the support structure.

8. A loadlock chamber as recited in claim 1, wherein the loadlock chamber has a cylindrical form factor.

9. A loadlock chamber as recited in claim 1, wherein said means for allowing transfer of the at least one semiconductor wafer from said interior of the loadlock chamber to the wafer fabrication process chamber comprises at least one access port connecting said interior with the wafer fabrication process chamber.

10. A loadlock chamber as recited in claim 9, the support structure including an opening through which the at least one semiconductor wafer may be inserted and extracted to and from the support structure, said loading means comprising a plate on which the support structure is supported, said plate capable of rotation to align the opening in the support structure with said at least one access port.

11. A loadlock chamber as recited in claim 10, the loadlock chamber further comprising a rotational sensor for sensing a rotational orientation of said opening on said plate with respect to said at least one access port.

12. A loadlock chamber as recited in claim 9, said loading means comprising a plate on which the support structure is supported, said plate capable of translation to vertically align the at least one semiconductor wafer with said at least one access port.

13. A loadlock chamber as recited in claim 1, said receiving means comprising:
  a port plate assembly capable of receiving and supporting the pod cover; and
  a port access door substantially coplanar with said port plate assembly, the port access door capable of supporting the pod door.

14. A loadlock chamber as recited in claim 13, wherein the support structure is supported on the pod door, said separating means comprising:
  means for moving said port plate assembly relative to said port access door so that the pod cover supported on said port plate assembly moves away from the pod door supported on said port access door; and
  a gripping mechanism mounted within and moving with said port plate assembly for gripping the support structure to move and separate the support structure away from the pod door.

15. A loadlock chamber as recited in claim 1, said receiving means comprising:
  a port plate assembly capable of receiving and supporting the pod cover, and
  a port access door substantially coplanar with said port plate assembly, the port access door capable of receiving and supporting the pod door; and
  said separating means comprising:
    means within said port access door for disengaging the pod cover from the pod door,
    means for moving said port plate assembly relative to said port access door so that the pod cover moves away from the pod door, and
    at least a pair of pawls mounted within and moving with said port plate assembly for grasping the support structure to move and separate the support structure away from the pod door.

16. A loadlock chamber as recited in claim 1, further comprising:
  purging means for flushing contaminants out of the pod after said separating means has separated the support structure from the pod.

17. A loadlock chamber as recited in claim 16, wherein said purging means comprises injection of a gas into the pod.

18. A loadlock chamber as recited in claim 17, said gas comprising an inert gas.

19. A loadlock chamber as recited in claim 17, said gas comprising a noble gas.

20. A loadlock chamber as recited in claim 17, wherein said gas is conditioned prior to injection into the pod.

21. A chamber for transferring a wafer provided within a support structure from a pod, in which the wafer is stored and/or transferred, to a wafer fabrication process, the pod including a pod door on which the support structure is supported, and a pod cover engaged with the pod door, the chamber comprising:
  an assembly on a top surface of the chamber capable of engaging and supporting the pod cover;
  sealing means on said assembly for providing a seal between the pod cover and said assembly;
  a port access door on a top surface of the chamber, the port access door capable of supporting the pod door, and said port access door moving between a first position in which said port access door seals an interior of the chamber and a second position in which said port access door allows entry into said interior;
  disengaging means as part of said port access door for disengaging the pod door from the pod cover;
  separation means as part of said assembly for separating the support structure from the pod door;
  means for transferring the support structure into said interior of the chamber when said port access door is in said second position; and
  means for transferring the wafer from said interior to the wafer fabrication process when said port access door is in said first position;
  wherein the chamber is capable of transferring the wafer from the pod to the wafer fabrication process in an environment that is sealed against an environment external to the pod and said chamber.

22. A chamber as recited in claim 21, further comprising means for purging contaminants from the pod.

23. A chamber as recited in claim 22, wherein said means for purging comprises means for injecting a gas into the pod cover after the support structure has been separated from the pod.

24. A chamber as recited in claim 21, said separation means comprising:
  means for moving said assembly relative to said port access door so that the pod cover moves away from the pod door; and
  a pair of pawls mounted within and moving with said assembly for grasping the support structure to move and separate the support structure away from the pod door.

25. A system for separating a semiconductor wafer cassette from a pod in which the semiconductor wafer cassette is stored and/or transported, the pod including a pod door on which the cassette is supported, and a pod cover engaged with the pod door, the system comprising:

an assembly for receiving and supporting the pod, said assembly including:
a first support surface for receiving and supporting the pod door, and
a second support surface, for receiving and supporting the pod cover;

disengaging means provided within said assembly for disengaging the pod cover from the pod door;

first moving means provided within said assembly for moving said second support surface with respect to said first support surface to separate the pod cover from the pod door;

gripping means supported on and moving with said second support surface for supportably gripping the cassette, and for lifting the cassette off of the pod door; and second moving means for moving said first support surface and the pod door away from the cassette.

26. A system for separating a semiconductor wafer cassette from a pod as recited in claim 25, further comprising sealing means for establishing a sealed environment between the pod cover and said assembly when the pod is received on said assembly, the cassette, pod door, and said first and second support surfaces being located within said sealed environment.

27. A system for separating a semiconductor wafer cassette from a pod as recited in claim 25, further comprising sealing means for establishing a sealed environment between the pod cover and said assembly when the pod is received on said assembly, the cassette being separated from the pod within said sealed environment.

28. A loadlock chamber for transferring a semiconductor wafer supported in a cassette from a pod in which the cassette is sealed into a semiconductor wafer fabrication process chamber, the pod including a pod door on which the cassette is supported, and a pod cover engaged with the pod door, the loadlock chamber comprising:

an assembly for receiving and supporting the pod;

a port door within said assembly for receiving and supporting the pod door and for sealing an interior of the loadlock chamber;

a support plate within said assembly for receiving and supporting the pod cover;

a disengaging mechanism provided within said assembly for disengaging the pod cover from the pod door;

a lifting mechanism provided within said assembly for lifting said support plate with respect to said port door to separate the pod cover from the pod door;

a gripping mechanism supported on and moving with said support plate for supportably gripping the cassette after the pod cover has been separated from the pod door, and for lifting the cassette off of the pod door as result of the movement of said support plate;

a moving mechanism provided within said assembly for moving said port door and the pod door out of a vertical path of the cassette and for moving said port door out of sealing engagement with said loadlock chamber interior;

a translating plate for moving into engagement with the cassette and for transporting the cassette into said loadlock chamber interior, said moving mechanism capable of moving said port door back into sealing engagement with the loadlock chamber interior to seal the loadlock chamber interior after the cassette is located within said loadlock chamber interior; and at least one access port for allowing transfer of the semiconductor wafer within the cassette from said loadlock chamber interior into the semiconductor wafer processing chamber.

29. A loadlock chamber as recited in claim 28, wherein transfer of the semiconductor wafer from the pod into the semiconductor wafer fabrication process chamber occurs in a sealed environment isolated from an environment surrounding the loadlock chamber.

30. A loadlock chamber as recited in claim 28, further comprising a pump associated with said loadlock chamber interior for evacuating said loadlock chamber interior to a pressure approximating that of the semiconductor wafer process chamber pressure.

31. A loadlock chamber for transferring a semiconductor wafer supported in a cassette into a semiconductor wafer fabrication process chamber, comprising:

a port door for receiving and supporting the cassette and for sealing an interior of the loadlock chamber;

a support plate provided circumferencially of said port door for receiving and supporting a cover capable of fitting over the cassette;

a lifting mechanism for lifting said support plate with respect to said port door;

a gripping mechanism supported on and moving with said support plate for supportably gripping the cassette and for lifting the cassette off of the pod door;

a moving mechanism provided within said assembly for moving said port door out of a vertical path of the cassette and out of sealing engagement with said loadlock chamber interior;

a translating plate for moving into engagement with the cassette and for transporting the cassette into said loadlock chamber interior, said moving mechanism capable of moving said port door back into sealing engagement with the loadlock chamber interior to seal the loadlock chamber interior after the cassette is located within said loadlock chamber interior; and at least one access port for allowing transfer of the semiconductor wafer within the cassette from said loadlock chamber interior into the semiconductor wafer processing chamber.

32. A loadlock chamber as recited in claim 31, wherein transfer of the semiconductor wafer into the semiconductor wafer fabrication process chamber occurs in a sealed environment isolated from an environment surrounding said cover and the loadlock chamber.

33. A method of transferring a semiconductor wafer supported within a support structure from a storage and/or transfer pod to a wafer fabrication process location, the pod comprising a pod door and a pod cover mating with the pod door, the method comprising the steps of:

locating the pod adjacent a loadlock chamber proximate to the wafer fabrication process location;

creating a sealed environment within the pod and said loadlock chamber; separating the support structure from the pod cover within said sealed environment;

separating the support structure from the pod door within said sealed environment;

transferring the support structure into an interior of said loadlock chamber after said support structure has been separated from the pod cover and pod door; and transferring the semiconductor wafer from said loadlock chamber interior into the wafer fabrication process location.

34. A method of transferring a semiconductor wafer supported within a support structure from a storage and/or transfer pod to a wafer fabrication process location as recited in claim 33, further comprising the step of purging the pod of contaminants after the support structure has been separated from the pod cover and pod door.

35. A method of transferring a semiconductor wafer supported within a support structure from a storage and/or transfer pod to a wafer fabrication process location as recited in claim 34, wherein the pod is purged with a gas injected into the pod.

36. A method of transferring a semiconductor wafer supported within a support structure from a storage and/or transfer pod to a wafer fabrication process location as recited in claim 33, further comprising the step of evacuating said loadlock chamber interior after the support structure has been sealed within said sealed environment.

37. In a system having one or more semiconductor wafers provided within a plurality of cassettes, each cassette provided within a pod, a method of loading the plurality of cassettes into a sealed operation chamber within an interior of the loadlock chamber, the one or more semiconductor wafers capable of passing from the operation chamber into a wafer fabrication process chamber, the method comprising the steps of:

loading a first pod on the loadlock chamber;

creating a first sealed environment within said first pod and said loadlock chamber;

separating a first cassette of the plurality of cassettes from said first pod within said first sealed environment;

transferring said first cassette into the operation chamber;

creating a second sealed environment within said operation chamber;

removing said first pod from the loadlock chamber with the first cassette remaining sealed within the operation chamber;

loading a second pod on the loadlock chamber;

recreating said first sealed environment within said second pod and said loadlock chamber;

separating a second cassette of the plurality of cassettes from said second pod;

opening the operation chamber so that the inside of said second pod and the operation chamber together comprise a third sealed environment;

transferring said second cassette into the operation chamber adjacent to said first cassette; and recreating said second sealed environment within said operation chamber.

38. A method of loading the plurality of cassettes into a sealed operation chamber as recited in claim 37, wherein said first cassette is transferred into the operation chamber by resting on an indexing plate that lowers into the operation chamber and said second cassette is transferred into the operation chamber by resting on said first cassette which is located on said indexing plate.

39. A method of loading the plurality of cassettes into a sealed operation chamber as recited in claim 37, further comprising the steps of:

removing a semiconductor wafer of the one or more semiconductor wafers from one of said first or second cassettes in which the semiconductor wafer is first located, said first and second cassettes being sealed within the operation chamber;

changing a vertical orientation of said first and second cassettes, said first and second cassettes being sealed within the operation chamber; and inserting the semiconductor wafer into one of said first or second cassettes in which the semiconductor wafer was not first located, said first and second cassettes being sealed within the operation chamber.

40. A method for transferring at least one semiconductor wafer supported within a cassette from a pod having a pod cover and a pod door with said cassette resting on said pod door, into a wafer fabrication process, the method comprising the steps of:

receiving the pod on a housing of a chamber;

opening said pod and said chamber without exposing the cassette or at least one semiconductor wafer to the atmosphere exterior to the pod and chamber;

positioning the cassette in direct contact with an upper support surface of a vertical transport device provided within said chamber;

transporting the cassette into an interior of said chamber via said vertical transport device.

41. A loadlock chamber for transferring at least one semiconductor wafer supported within a support structure from a pod into a wafer fabrication process chamber without exposing the at least one semiconductor wafer or support structure to an atmosphere exterior to the pod and loadlock chamber, the pod including a pod door and a pod cover mating with the pod door, the upper surface of the loadlock chamber defining a fixed reference plane, the loadlock chamber comprising:

means for receiving the pod;

separation means for separating the support structure from the pod, said separation means including:

first means for raising the pod cover with respect to the fixed reference plane while the pod door and the support structure remain in a fixed position with respect to the fixed reference plane, and second means for raising the pod cover and the support structure with respect to the fixed reference plane while the pod door remains in a fixed position with respect to the fixed reference plane;

means for loading the support structure into an interior of the loadlock chamber without exposing the support structure or at least one semiconductor wafer to the atmosphere exterior to the pod and loadlock chamber.

* * * * *

UNITED STATES PATENT AND TRADEMARK OFFICE
CERTIFICATE OF CORRECTION

PATENT NO.   : 5,586,585
DATED        : Dec. 24, 1996
INVENTOR(S)  : Anthony C. Bonora & Joshua T. Oen It is certified that error appears in the above-indentified patent and that said Letters Patent is hereby corrected as shown below:

Col. 10, line 29:   "CUP" should be "CPU"

Signed and Sealed this

Twenty-seventh Day of May, 1997

Attest:

BRUCE LEHMAN

*Attesting Officer*        *Commissioner of Patents and Trademarks*